US007062411B2

(12) United States Patent
Hopkins et al.

(10) Patent No.: US 7,062,411 B2
(45) Date of Patent: Jun. 13, 2006

(54) METHOD FOR PROCESS CONTROL OF SEMICONDUCTOR MANUFACTURING EQUIPMENT

(75) Inventors: Michael Hopkins, Dublin (IE); John Scanlan, Waterford (IE); Kevin O'Leary, Dublin (IE); Marcus Carbery, Dublin (IE)

(73) Assignee: Scientific Systems Research Limited, Dublin (IE)

( * ) Notice: Subject to any disclaimer, the term of this patent is extended or adjusted under 35 U.S.C. 154(b) by 73 days.

(21) Appl. No.: 10/791,132

(22) Filed: Mar. 2, 2004

(65) Prior Publication Data

US 2004/0254762 A1 Dec. 16, 2004

(30) Foreign Application Priority Data

Jun. 11, 2003 (IE) ................................ 2003/0437
Oct. 3, 2003 (IE) ................................ 2003/0730

(51) Int. Cl.
*G06F 15/00* (2006.01)

(52) U.S. Cl. ........................... 702/185; 702/34; 702/81; 700/110; 714/25; 714/48; 324/512; 324/737

(58) Field of Classification Search .................. 702/34, 702/35, 81, 104, 185; 700/110; 714/25, 714/48; 324/512, 737; 382/149; 340/679, 340/680
See application file for complete search history.

(56) References Cited

U.S. PATENT DOCUMENTS

| 5,479,340 | A | 12/1995 | Fox et al. |
| 5,926,690 | A | 7/1999 | Toprac et al. |
| 6,174,450 | B1 | 1/2001 | Patrick et al. |
| 6,192,287 | B1 | 2/2001 | Solomon et al. |
| 6,262,550 | B1 * | 7/2001 | Kliman et al. .............. 318/565 |
| 6,393,373 | B1 * | 5/2002 | Duyar et al. ................ 702/115 |
| 6,441,620 | B1 | 8/2002 | Scanlan et al. |
| 6,586,265 | B1 | 7/2003 | Chiou et al. |
| 6,671,818 | B1 * | 12/2003 | Mikurak ........................ 714/4 |
| 6,772,633 | B1 * | 8/2004 | Terry et al. ................... 73/587 |
| 2003/0042861 | A1 * | 3/2003 | Schwartz et al. .......... 318/434 |

FOREIGN PATENT DOCUMENTS

EP 0 878 842 A1 11/1998
WO WO 01/99145 A1 12/2001

OTHER PUBLICATIONS

Schaik et al., 'Conditon Based Maintenance on MV Cable Circuits as Part of Asset Management Philosophy, Diagnostic Methods, Experiences, Results and the Future', Jun. 2001, IEEE Artile, No. 482, pp. 1-5.*
James et al., 'Development of Computer-Based Measurements and their Applications to PD Pattern Analysis', Oct. 1995, IEEE Article, vol. 2, No. 5, pp. 838-856.*
Ison et al., 'Fault Diagnosis of Plasma Etch Equipment', Jun. 1998, Berkeley University, pp. 1-4.*

* cited by examiner

*Primary Examiner*—Marc S. Hoff
*Assistant Examiner*—Elias Desta
(74) *Attorney, Agent, or Firm*—Kilpatrick Stockton, LLP

(57) ABSTRACT

A method of fault identification on a semiconductor manufacturing tool includes monitoring tool sensor output, establishing a fingerprint of tool states based on the plurality of sensors outputs, capturing sensor data indicative of fault conditions, building a library of such fault fingerprints, comparing present tool fingerprint with fault fingerprints to identify a fault condition and estimating the effect of such a fault condition on process output. The fault library is constructed by inducing faults in a systematic way or by adding fingerprints of known faults after they occur.

10 Claims, 12 Drawing Sheets

(A)

(B)

(A)

(B)

| Wafer Number | Forced Change | Change Direction |
|---|---|---|
| 1 | Argon | - |
| 2 | Argon | Nominal |
| 3 | Argon | + |
| 4 | C5F8 | - |
| 5 | C5F8 | - |
| 6 | C5F8 | Nominal |
| 7 | C5F8 | + |
| 8 | C5F8 | + |
| 9 | Gap | - |
| 10 | Gap | - |
| 11 | Gap | Nominal |
| 12 | Gap | + |
| 13 | Gap | + |
| 14 | Oxygen | - |
| 15 | Oxygen | - |
| 16 | Oxygen | Nominal |
| 17 | Oxygen | + |
| 18 | Oxygen | + |
| 19 | Power | - |
| 20 | Power | - |
| 21 | Power | Nominal |
| 22 | Power | + |
| 23 | Power | + |
| 24 | Pressure | - |
| 25 | Pressure | - |
| 26 | Pressure | Nominal |
| 27 | Pressure | + |
| 28 | Pressure | + |

Fig. 13

METHOD FOR PROCESS CONTROL OF SEMICONDUCTOR MANUFACTURING EQUIPMENT

BACKGROUND OF THE INVENTION

The present invention relates to a method of fault detection in manufacturing equipment, especially, but not limited to, semiconductor manufacturing equipment using plasma chambers.

The manufacture of semiconductor integrated circuits is a detailed process requiring many complex steps. A typical semiconductor manufacturing plant (or fab) can require several hundred highly complex tools to fabricate intricate devices such as microprocessors or memory chips on a silicon substrate or wafer. A single wafer often requires over 200 individual steps to complete the manufacturing process. These steps include lithographic patterning of the silicon wafer to define each device, etching lines to create structures and filling gaps with metal or dielectric to create the electrical device of interest. From start to finish the process can take weeks to complete.

Faults can and do occur on these manufacturing tools. A fault on a single wafer can compromise all devices on that wafer and all subsequent steps on that wafer may be worthless and the wafer scrapped. Thus, timely and effective fault detection is a necessity. An example semiconductor manufacturing tool is depicted in FIG. 1 and shows a plasma processing chamber 1, a substrate to be processed 2, process inputs or set-points 3, tool-state and process-state sensor outputs 4 and a data collection interface 5.

The manufacturing tools are complex and many different faults can occur, some specific to the tool process being run at the time, that impact tool productivity and yield (in the case of a plasma chamber, the process being run at any given time is known in the art as the "recipe"). As an example of the type of faults that can occur, consider a thermal chemical vapour deposition (CVD) tool, used to deposit layers of semiconductor or dielectric materials in the device manufacture. The quality of the process is determined by the output, measured by some metrics such as film uniformity, stress and so on. The quality of the output in turn depends on the process inputs, for example gas flow rates, reactor pressure and temperature in the case of the thermal CVD tool. If there is a deviation in any of the process parameters, then the quality of the output may be negatively impacted.

Another type of fault concerns excursions in the process itself. There are many examples, including a compromise in chamber vacuum, a change in reactor wall conditions or chamber hardware, an electrical arc or even a problem with the incoming wafer. Again the quality of the output will be affected with possible impact on tool yield.

A common feature in all of these faults is that sensors on the tool will generally indicate a change in system state, although this does depend on the sensitivity of the tool sensors. Plasma processing chambers are typically equipped with tool-state sensors, for example gas flow meters and pressure gauges, and process-state sensors, for example optical emission detectors and impedance monitors. If a process input changes, then, generally, some of the tool sensors will register that change. If the process reactor conditions change, again the tool sensors will register a change.

The most common approach to process control and fault detection on semiconductor manufacturing tools is Statistical Process Control (SPC), whereby many if not all of the process inputs are recorded and control charts are monitored for out-of-control events. FIG. 2 shows a typical SPC chart based on sensor data from a semiconductor manufacturing tool. Control limits are based on statistically improbable deviations from the data mean. They are shown as an Upper Control Limit (UCL) and a Lower Control Limit (LCL) in FIG. 2. Typically these limits are set at 3 or 4 times the standard deviation (sigma) from the mean of the data set, using a normal distribution model. This control technique has a number of limitations.

The first problem is that monitoring all SPC charts is not scalable, since there can be ten's of sensors per tool and several hundred tools in the fab. The second problem is that individual sensor outputs can stray outside control limits, with no apparent effect on the process output and/or process inputs can remain within control limits but process output can drift out-of-control due to changes in the process conditions. This is because the processing tools are typically complex and their output depends on their combined inputs as well as the conditions of the tool itself. It is for this reason that the semiconductor fab usually uses regular process quality sampling on test wafers since this is at least predictive of yield. For example, test wafers are frequently run to check process quality such as film stress in the case of a CVD process or critical dimension (CD) in the case of an etch process. This is known to be a very expensive approach to process control, since running test wafers and halting real production to test process quality negatively impacts factory yield and productivity. The third problem relates to the difficulty of setting SPC limits on the tool sensors. The SPC approach is statistical and assumes normally distributed data. This is generally not the case. Tool and sensor drift as well as normal tool interventions such as preventive maintenance (PM) activity result in a data set which is not normally distributed.

FIG. 3 shows two data streams for output parameters 1 and 2 from a sensor in an oxide etch plasma processing tool over a period of about 1100 wafers, during which time a pressure fault was detected at wafer number 1018. The fault was caused by a defective pressure controller. Two preventative maintenance (PM) wet-cleans of the plasma chamber were carried out in the interval preceding the fault. These PM events and chamber cycling effects are clearly visible in the raw data. It will also be seen that the data is highly non-normal, with auto-correlation and discontinuities. The SPC approach therefore cannot handle this data effectively and significant events can be lost in the data. Indeed, in the example of FIG. 3, the fault which occurred at wafer 1018 is impossible to pick out of the data using the SPC approach.

Multivariate statistical techniques have been used in an attempt to offset the first two problems mentioned above (e.g. U.S. Pat. No. 5,479,340). Multivariate techniques take into account not only the individual variance of the control parameters, but also their covariance. This addresses some of the shortfalls of SPC techniques in that the multivariate statistic can be used to compress the data and thus reduce the number of control charts resulting in a more scalable solution. For example, it is possible to replace a multitude of sensor data streams with a single statistic, such as a Hotelling $T^2$, which captures the individual sensor variance and sensor-to-sensor covariance. Using these techniques the number of control charts is greatly reduced and the single statistic is more representative of overall system health.

However, since the multivarate approach is statistically based, the third problem is not addressed. This is illustrated in FIG. 4, which shows a Hotelling $T^2$ statistic based on the sensor data including the streams shown in FIG. 3 (as well as streams for many more sensor output parameters). As mentioned, there is only one fault event in this data set, that occurring on wafer 1018. All other data, including drift and PM discontinuities are normal. However, this single multivariate statistic reports a couple of statistical excursions with greater than 99% confidence because they deviate from statistically normal behaviour, but misses the real fault condition. The multivariate statistical approach has an additional shortcoming. The magnitude of the excursion is difficult to interpret, again because it is statistically based. A large deviation in the statistic may not necessarily correspond to a very significant process quality issue, whereas a small deviation may occasionally indicate a major process excursion.

A further issue arises when using the statistical approach in a multi-tool semiconductor manufacturing site. In practice, plasma processing chambers are not perfectly matched. Sensor responses on one chamber are not identical to, and may differ substantially from, sensor responses on another chamber of the same type (i.e. built to the same nominal specification), even when running the same recipe. Therefore, a statistical fault detection model cannot be transferred from one chamber to another, as small differences in sensor response would trigger a false alarm. The statistical model needs to be derived from chamber to chamber. This is a further limitation in the approach.

As mentioned above, as well as statistical monitoring of manufacturing equipment, process control in the semiconductor industry uses regular process quality sampling. Indeed, since yield is directly determined by process quality, ultimately this is the most robust technique. However, measuring the process quality of every wafer at every process step, in particular taking measurements from the wafer, is prohibitive in terms of reduced factory throughput and cost of measuring equipment. U.S. Pat. No. 5,926,690 describes a method for process control on an etch tool based on measuring CD (critical dimension) and controlling the process by varying etch time based on the measurement. A single process quality output, CD, is controlled by selectively altering a single process input, photoresist etch time. If the film measurement tool is integrated with the etch tool then the CD can be measured before and after every wafer is run and adjustments made on the fly. This method of process control relies on precise measurement of the CD and determining if a change is significant or not on all wafers or a reasonable statistical sample. However, the reliance on accurate determination of, in this case, CD, or in the general case, a process quality metric, makes the technique very expensive to operate. An alternative approach in which it is not necessary to have a precise measurement of a process quality metric would be advantageous.

Another concept for process control is described in U.S. Pat. No. 6,174,450. In this case, a single process parameter, namely direct current bias, is controlled by varying RF power. The concept is that by fixing a particular process input, a particular process output will be better controlled. One problem with this approach is that the process output depends on several inputs and unless all are controlled, the process output cannot be inferred.

A separate but related problem is that of tool matching. Typically, the manufacturing plant is set up in process lines, each line devoted to a particular process step. For example, the fab will contain a lithography line, an etch line, a deposition line and so on. Wafers are processed through each line as the process of building the devices proceeds. Each individual line will consist of a similar set of tools, each with at least one plasma processing chamber. A typical fab may contain tens of similar chamber types, devoted to a set of process steps. These process steps are each assigned individual recipes and as a particular device is being processed many chambers will be employed to run a given recipe on all wafers processed in the manufacturing plant. Ideally, a recipe run on any given process chamber will produce the same output in terms of device quality as on all other similar chambers. For example, running a particular etch recipe, ideally all of these chambers etch the wafer at the same rate, with the same across-wafer uniformity, and so on. However, as discussed, differences between outwardly similar chambers can and do occur, resulting in a mis-matched output set. This mis-match ultimately impacts factory productivity and yield.

The chamber-to-chamber mis-match is presently dealt with in a couple of ways. Firstly, every attempt is made to design processes with wide operation windows so that small chamber-to-chamber differences have a negligible effect on the process output. Secondly, large differences in chamber output are tolerated by device sorting according to final specification; for example, speed binning in the case of micro-processor manufacturing. Thirdly, every attempt is made to make all chambers the same. This can involve trial-and-error parts swapping as well as extensive calibration checks and it is generally a laborious approach.

As semiconductor fabs begin to process devices with transistor gate lengths and line-widths less than 100 nm, process windows have become increasingly tight exacerbating the impact of chamber-to-chamber output differences. Device specification sorting is expensive as below par devices have much lower market value. Finally, the effort to make all chambers the same by trial-and-error parts swapping and calibration checks is a diminishing returns equation, since in many cases great time and effort can be spent on the problem.

Measuring chamber output is a sure way of determining output differences. Indeed regular process quality checks are generally employed in fabs to do just that. These quality checks are generally ex-situ and a time delay is inevitable between processing a set of wafers and knowing if the output differences will impact yield. Ex-situ monitoring is an increasingly expensive approach and it would be much more advantageous to determine chamber-to-chamber differences prior to the ex-situ determination of output quality.

As mentioned, the sensor responses on one chamber may differ substantially from sensor responses on another chamber of the same type running the same recipe. These differences will reflect some or all of the following:

(a) "real" chamber-to-chamber differences which will be manifested in the output from these chambers, (b) benign chamber-to-chamber differences based on chamber condition, build tolerance and chamber life-cycle, and (c) small differences in the outputs of the sensor set on each tool due to different calibration margins.

The problem with using the raw sensor data to determine (a) above is that it is confounded by (b) and (c).

Isolating chamber-to-chamber differences in real time provides the fab operator with definitive information on process quality output from a given fab line. Having isolated a poorly matched chamber, the next step is to return that chamber to a state which matches the line set. As stated above, the approach is often trial-and-error, involving parts swap-out and calibration until the chamber outputs are matched. Real-time classification of the root cause of chamber differences would be far more advantageous.

U.S. Pat. No. 6,586,265 recognises the chamber mismatch problem and discloses a method for optimising process flow based on choosing an optimum processing path through a set of process lines. This approach makes no effort to solve chamber mis-matches and badly matched chambers would be used as little as possible.

In the March 2003 proceedings of the European Advanced Process Control Symposium, a method for isolating chamber differences during tool manufacture and test was disclosed. This method collects all sensor data associated with individual process chambers on a given tool and constructs a principal component model (PCA) of the sensor data set. PCA effectively captures all process variance from a correlated multi-variable data set (the sensors) in a set of uncorrelated principal components, each a linear combination of the original set. The first principal component accounts for as much as possible of the variation in the original data, the second component accounts for as much as possible of the remaining variation and is not correlated with the first component and so on. It is generally found, particularly when the sensor data set is correlated as on the process tools, that the majority of the variance is captured in the first few principal components. Therefore, plotting tool sensor data in PCA space allows the user to view most of the sensor variance easily and capture chamber-to-chamber differences. However, the variance as viewed in PCA space remains a confounding of real (output-impacting) chamber differences, benign chamber differences and sensor set differences. Furthermore, there is no provision for classifying the underlying root cause of the difference.

It is therefore an object of the invention to provide an improved method of fault detection in manufacturing equipment, especially but not limited to semiconductor manufacturing equipment using plasma chambers, which can be used to avoid or mitigate the problems of process control and chamber matching as discussed above.

SUMMARY OF THE INVENTION

Accordingly, the present invention provides a method of fault detection in manufacturing equipment having at least one sensor with at least one output indicative of the present state of the equipment, comprising the steps of:
(a) establishing sensor data that are representative of a state of the equipment under a fault condition generating a recordable fault fingerprint,
(b) storing the data in a fault fingerprint library,
(c) determining the present state of equipment using at least one sensor, and
(d) detecting a fault based on a comparison of the present state sensor data with at least one fault fingerprint in the fault fingerprint library.

BRIEF DESCRIPTION OF THE DRAWINGS

Embodiments of the invention will now be described, by way of example, with reference to the accompanying drawings, in which:

FIG. 13 is a table showing the induced changes generating the results shown in FIG. 12.

DETAILED DESCRIPTION OF THE PREFERRED EMBODIMENTS

In a first embodiment of the invention, a method for process control of semiconductor manufacturing equipment comprises first determining a tool profile for each tool on which the method is to be applied. In this embodiment, the tool profile is constructed from a plurality of tool sensor data. The sensor data can be multidimensional data from a single sensor or data from a set of sensors but in either case the data must be sensitive to tool-state and process-state changes. The important criterion is that the sensor data has sufficient dimensions to permit a plurality of different fingerprints to be defined for a respective plurality of different fault conditions. As used herein, a "fingerprint" is a set of sensor data which defines a particular state of the equipment—thus a fault fingerprint means a set of sensor data defining the state of the equipment in a fault condition.

Figure 5:
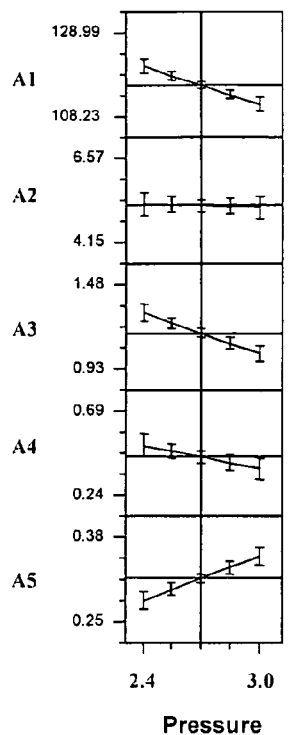
FIG. 5 shows sensor output responses as a function of some typical process inputs.
Figure 5:
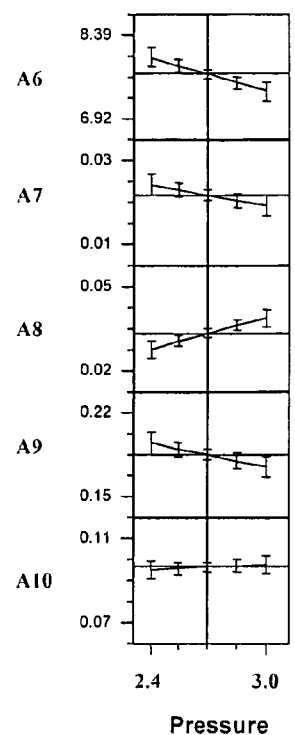
Figure 5:
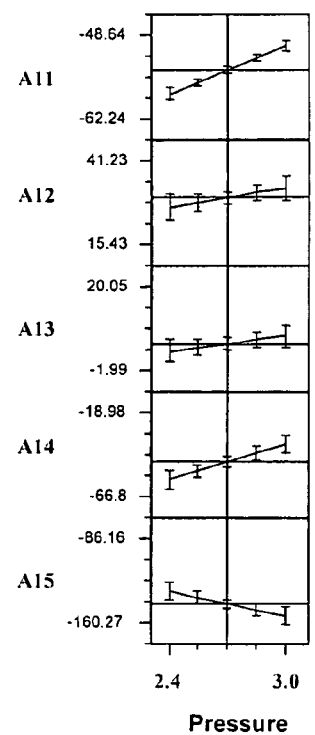
Figure 5:
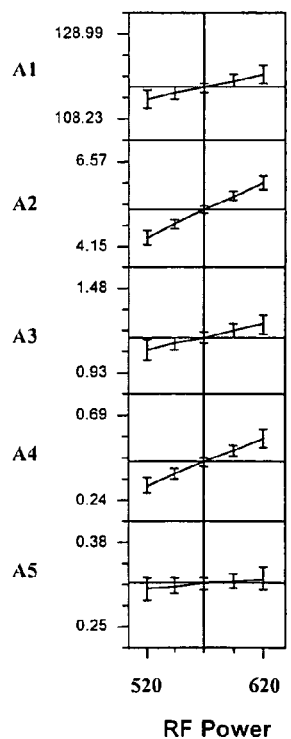
Figure 5:
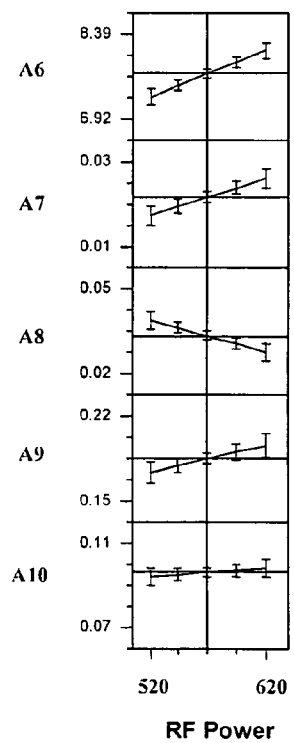
Figure 5:
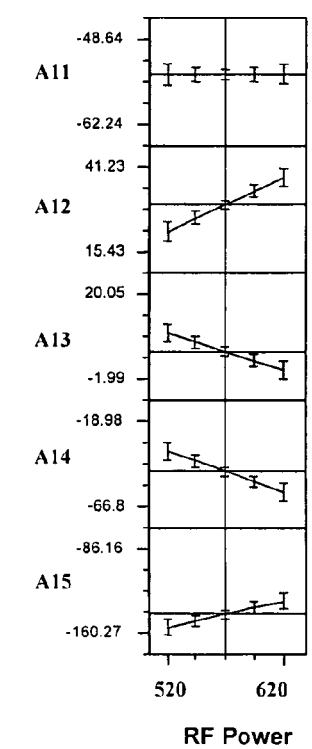

FIG. 5 shows a portion of a typical tool profile for a plasma chamber running a particular etch recipe. The response of 15 sensor outputs A1 . . . A15 is shown for changes in each of two tool inputs. In this case sensor outputs are values for voltage, current and phase for five RF harmonics produced through RF excitation of the plasma and the tool inputs are RF power and process pressure. It will be seen that each sensor output value changes according to which process input has changed. For example, the output value A8 will decrease as delivered RF power increases but the value increases as pressure increases. Thus, especially when all sensor outputs are taken into account, a change in process pressure will be different and distinguishable from a change in delivered RF power. If many of the tool inputs are changed in a design of experiments then a complete tool profile comprising a set of sensor responses for process inputs can be established. In fact, the changes shown in FIG. 5 are changes relative to the mean of the sensor value taken over several runs, since even for a single chamber the sensor values can vary slightly for the same recipe, although far less than variations between chambers.

Figure 6:
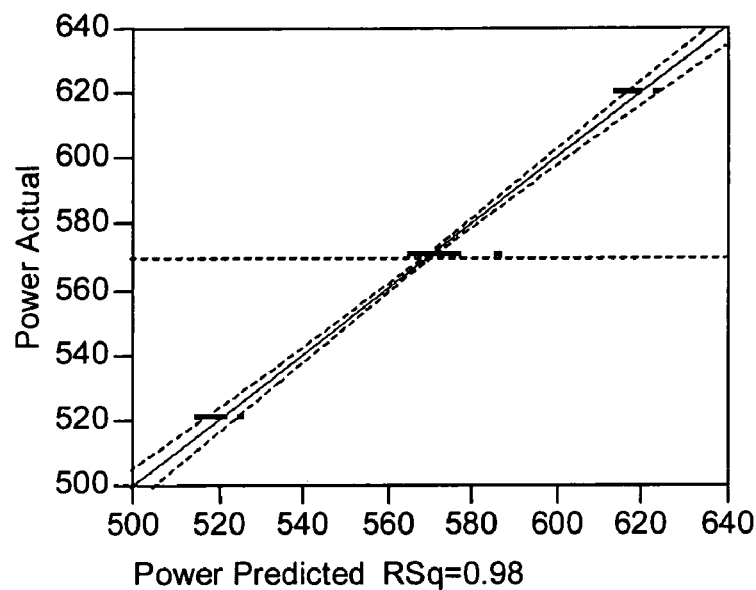
FIG. 6 shows an example of correlation of sensor output with process input.

The invention relies on the reliability of sensor outputs to predict process-input values independently of the nominal settings of the input values. FIG. 6 shows a plot of a typical process input value, in this case RF power, versus the input value predicted from tool sensor outputs such as the response curves of the plasma etcher RF sensors of FIG. 5. It can be seen that in this case there is typically good correlation between the actual input and the predicted value of that input based on the sensor output data. Thus, the tool sensors can be used to accurately predict at least one tool input. So for example, in a fault condition, even though an operator may have set RF power to a nominal value, sensor data can provide a more reliable measure of the RF power delivered than the equipment controlling the delivery of the RF power.

As noted in U.S. Pat. No. 6,441,620, the tool profile can be used to apply a signature to a particular input. Thereafter, if the sensor outputs change and those changes match the changes expected from the set of learned response curves, then the fault root cause is immediately classifiable. However, U.S. Pat. No. 6,441,620 is only useful in diagnosing a fault once it has been detected for example by testing a product after processing; it cannot detect a fault as it is happening or when it is likely to happen.

As will be explained below, in the present method, a fault fingerprint is classified before a fault is encountered and this procedure ensures the method is very robust in detecting such faults.

Once the tool profile has been built, a library of known fault fingerprints is generated by either simulating faults e.g. by forcing a change in tool inputs and measuring the change in sensor outputs; by learning fault fingerprints as new faults occur; or by importing fault fingerprint data from other tools. This last option is highly advantageous as it avoids time spent learning a model for each tool in the manufacturing plant. In the present context, a tool fault is a deviation in the state of the tool which actually causes an unacceptable adverse effect on the quality of product produced by the tool, or which if left unattended, is likely to worsen to produce such an effect.

Figure 7:
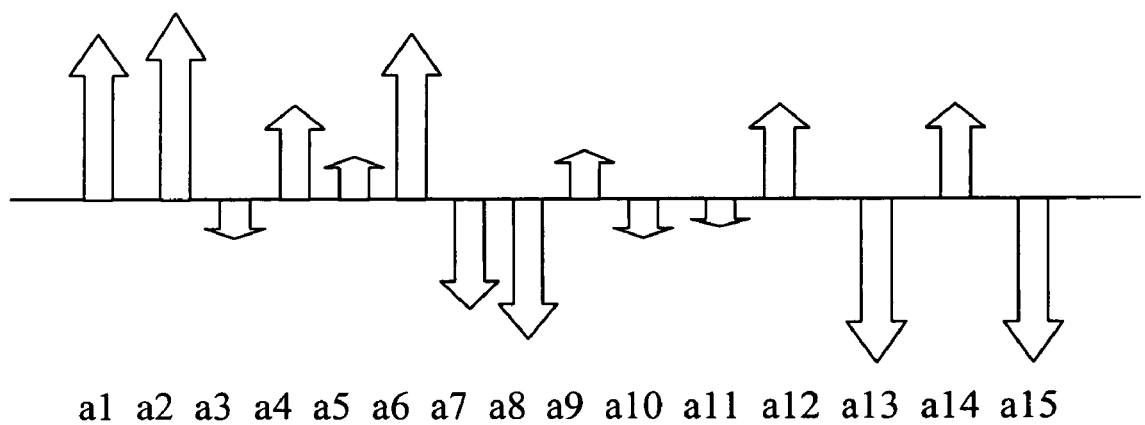
FIG. 7 shows a typical fault fingerprint constructed from fifteen sensor parameters.

In the embodiment, fault fingerprints are stored as differences in sensor output values from their tool profile values for nominal process input values. FIG. 7 is a visual representation of typical changes in the sensor data representing a fault fingerprint, as compared to data from the same sensor(s) in the absence of the fault. For example, a fault such as RF Power drifting above its nominal value may be characterised by a fault fingerprint comprising a negative value for A8, a positive value for A9, etc. These differences are referred to as vectors, since each has a magnitude (length of arrow in FIG. 7) and a direction (plus or minus).

A tool profile is required for each tool since, as discussed, the absolute values for sensor outputs generally vary from tool to tool even though the tools are of the same type and running the same recipe. However, the preferred embodiment is based on the fact that the rate of change (slope in FIG. 5) of sensor outputs will be substantially the same from one tool of the same type to another, at least when running the same nominal recipe. This means that the fault fingerprints are substantially invariant across tools of the same type and running the same nominal recipe, and enables fault fingerprints to be validly ported from one tool to another. It also means that the changes in sensor output, i.e. the slopes in FIG. 5, only need to be determined for one good tool of a given type running a given recipe. Having determined these slopes, the tool profiles for other tools of the same type, running the same recipe, may comprise only the sensor output values for nominal process input values.

Finally a fault condition is determined by comparison of the present tool state in terms of the deviation of measured sensor output values from their nominal values as indicated by the tool profile, FIG. 5, with the fingerprints for any known fault states, FIG. 7. Each set of vectors representing a fault stored in the fault library is correlated with the corresponding set of vectors for the present tool state and a fault is detected if there is a significant match between the present tool state and a tool state defined by a set of vectors representing a fault stored in the library. If the deviation matches a fingerprint in the fault library then it is flagged.

Figure 1:
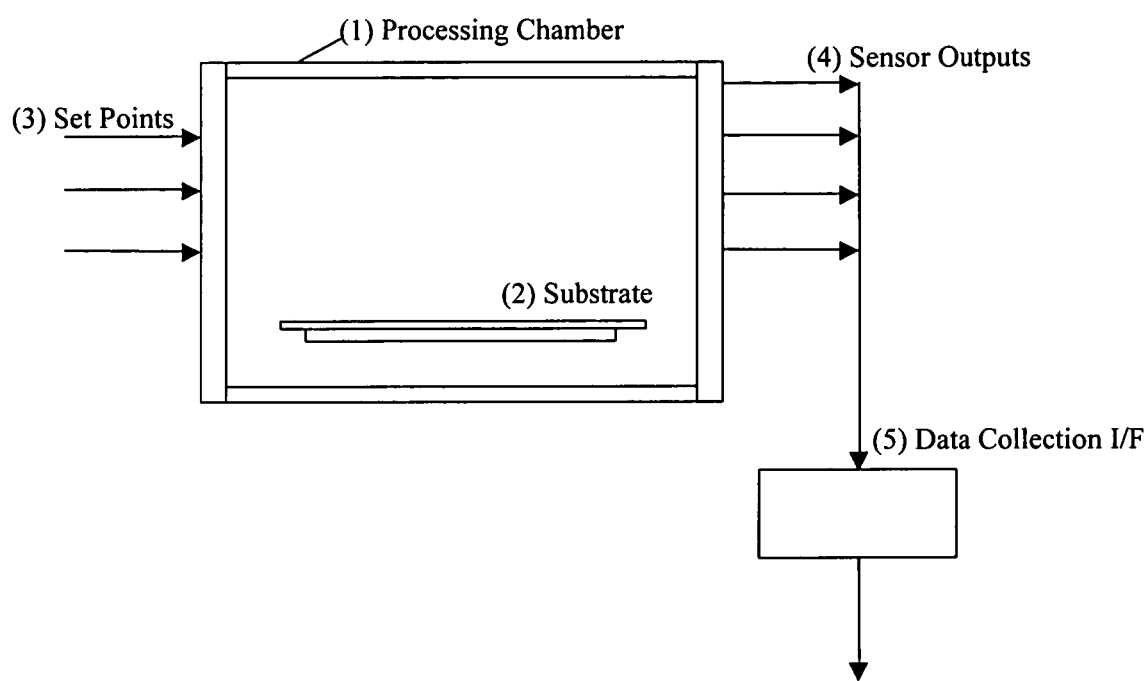
FIG. 1 depicts a typical semiconductor manufacturing tool with input settings and sensor outputs indicating equipment state.
Figure 2:
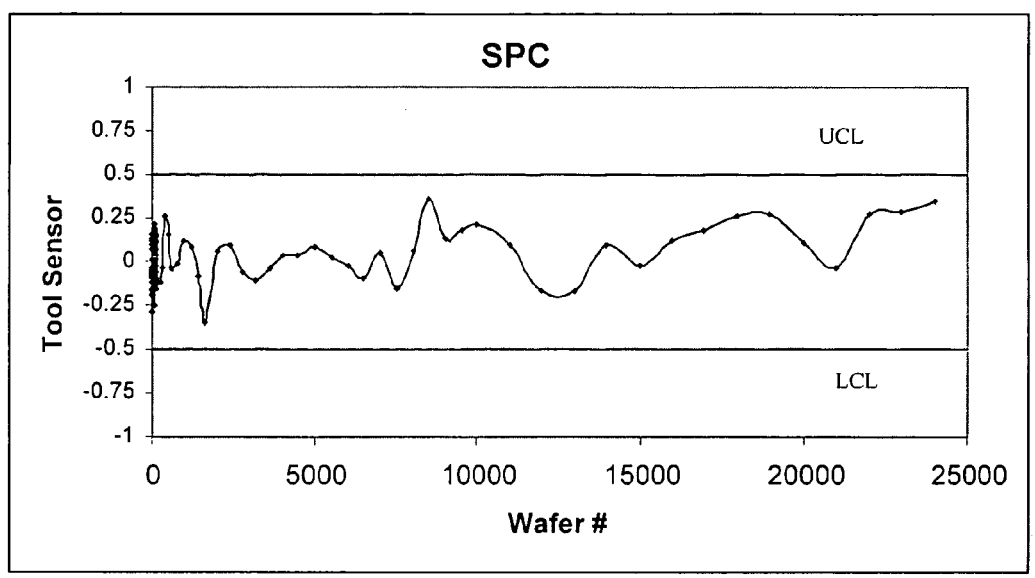
FIG. 2 shows a statistical process control chart based on one of the sensor outputs.
Figure 3:
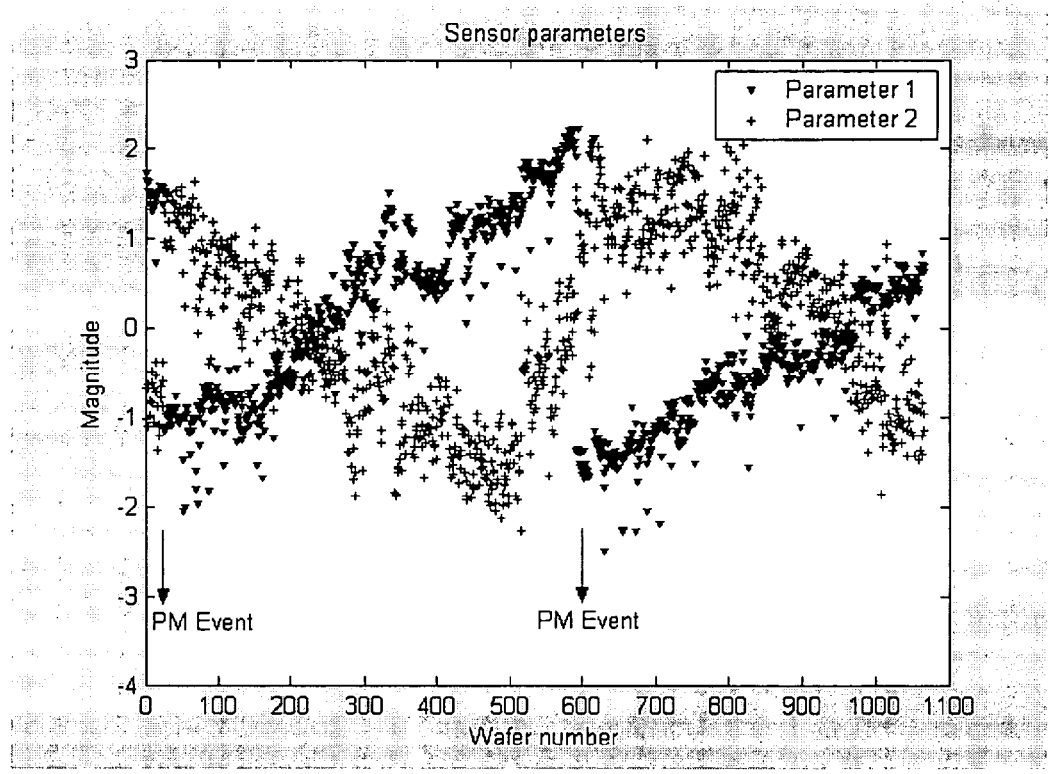
FIG. 3 shows unprocessed sensor data over a period of time which includes preventive maintenance events and a real fault.
Figure 4:
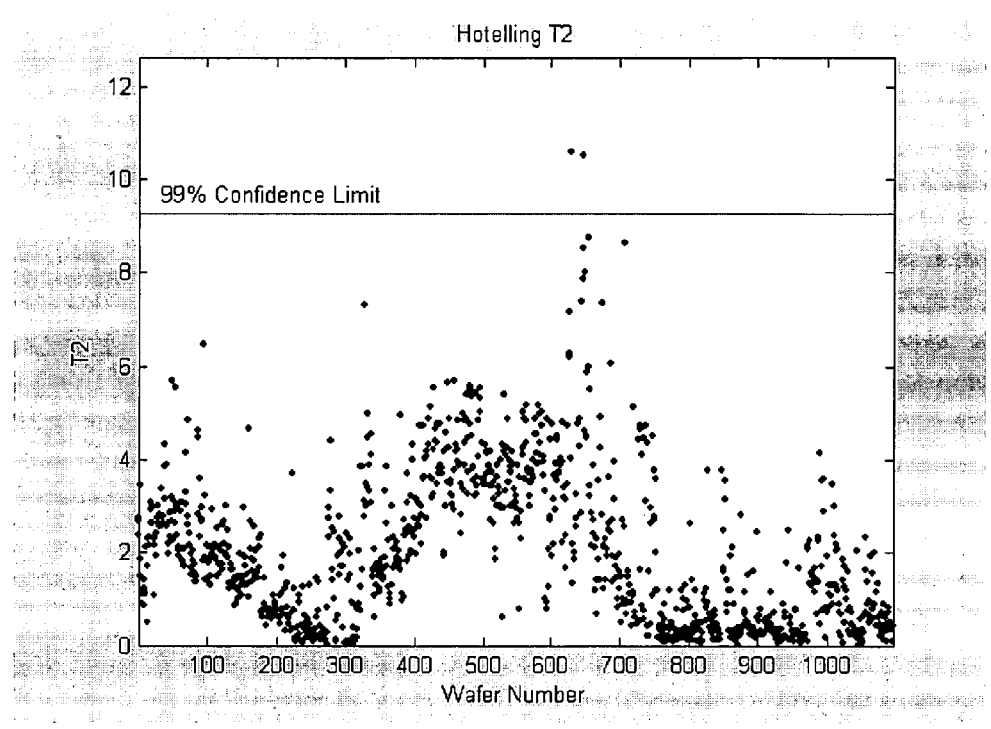
FIG. 4 shows a multivariate Hotelling $T^2$ process control chart based on a selection of tool sensor outputs.

It can be seen from FIG. 3 that the variation in the individual sensor outputs from run to run can be relatively large; however, in this method unless the variation in each of the individual sensors closely match a known variation pattern, i.e. a fault fingerprint, then it is ignored. If the sensor data has many dimensions, then the probability of a false match is negligible. Thus process control in this method proceeds by comparing the present condition to fault conditions and not to normal conditions and this makes the technique very robust.

It will also be seen from the above, that in order to detect a fault, the tool profile need only contain sensor output values for nominal process input values. However, as will be explained later, it is necessary for determining the effect of the fault on process outputs to understand the rate of change of sensor outputs versus process inputs.

The embodiment can be applied to learn the fingerprints of any new faults that occur and add them to the fault library. When a new fault appears the plurality of tool sensors will report a change in state. On first occurrence, there will be no matching fingerprint in the fault library and the fault cannot be classified. Fingerprints of new faults can be added when the fault is confirmed independently, for example, by metrology. Thereafter, if this fault reappears, it is instantly classified. The method thus allows for continuous learning and expansion of the fault library.

As mentioned above, to accelerate learning, these changes, representing typical fault conditions, can also be induced. For example, the integrity of the hardware and process can be deliberately compromised so that these fingerprints are recorded and included. Examples might be induced air leak, omission of or mis-fitting of hardware components, wafer misplacement and so on.

In the embodiment, having flagged a fault condition of the chamber, the next step is to determine if that fault will have an effect on process output.

It will be seen that the response curves of FIG. 5 relate magnitude in sensor output change to magnitude of process input change.

Figure 8:
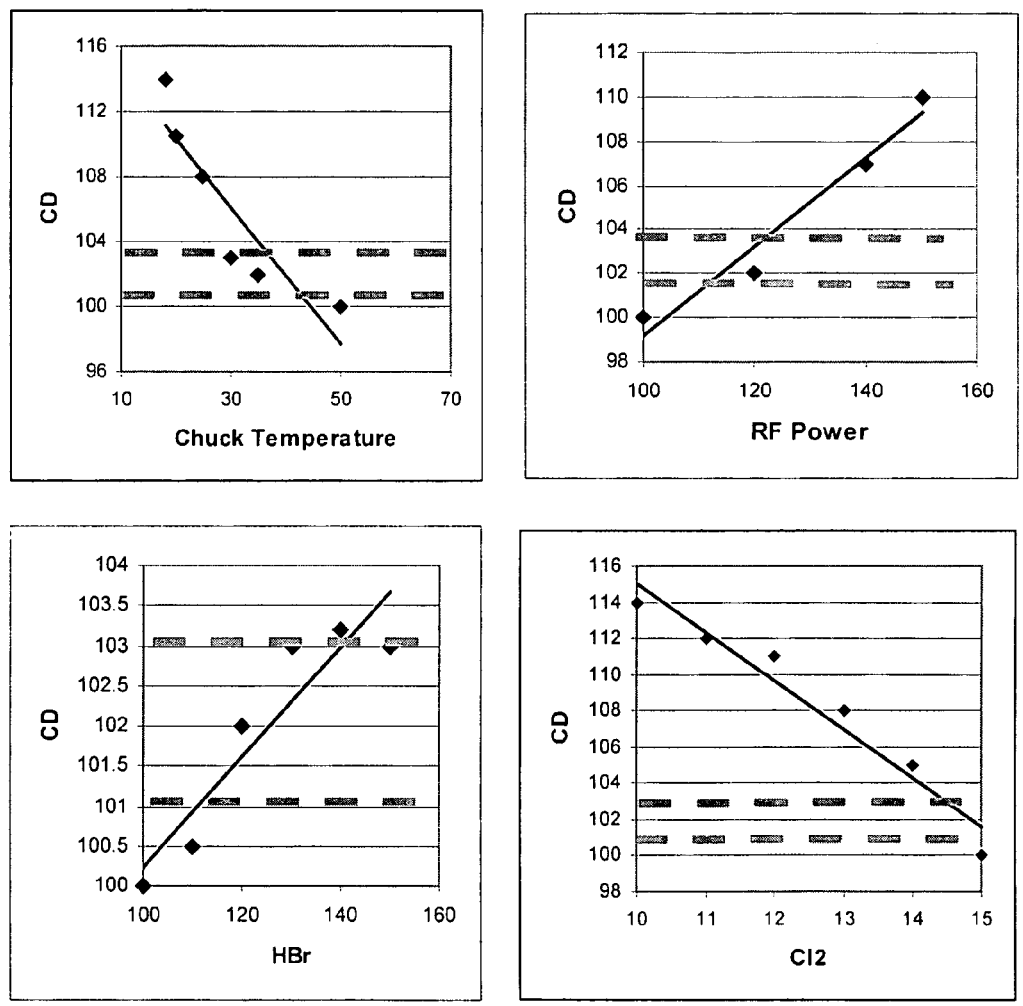
FIG. 8 shows an example of correlation of process output with process input.

FIG. 8 shows a set of plots showing dependence of process output on process input. These dependencies are typically well known for a given manufacturing tool. The pair of horizontal dashed lines correspond to a "window" within which the respective metric must lie for the product to meet its target specification. In this case, an etch process, the target specifications are for a post-etch CD (critical dimension) of between 101 nm and 103 nm. Thus, if the method as described above indicates that a fault has occurred and that, for example, the fault is a deviation in HBr flow of 15 sccm from the set point of 130 sccm, then the impact on CD is to produce CDs wider than tolerated by the target specifications. Therefore, a fault is flagged and the process is stopped. Now, since the operator knows where the fault lies, s/he can proceed to fixing the fault immediately.

Thus, it is possible to predict not only that a certain fault has occurred, but because the size of the fault i.e. the change in process output caused by the deviation in process input, can be determined, this can then be used to estimate impact on process output quality.

Figure 9:
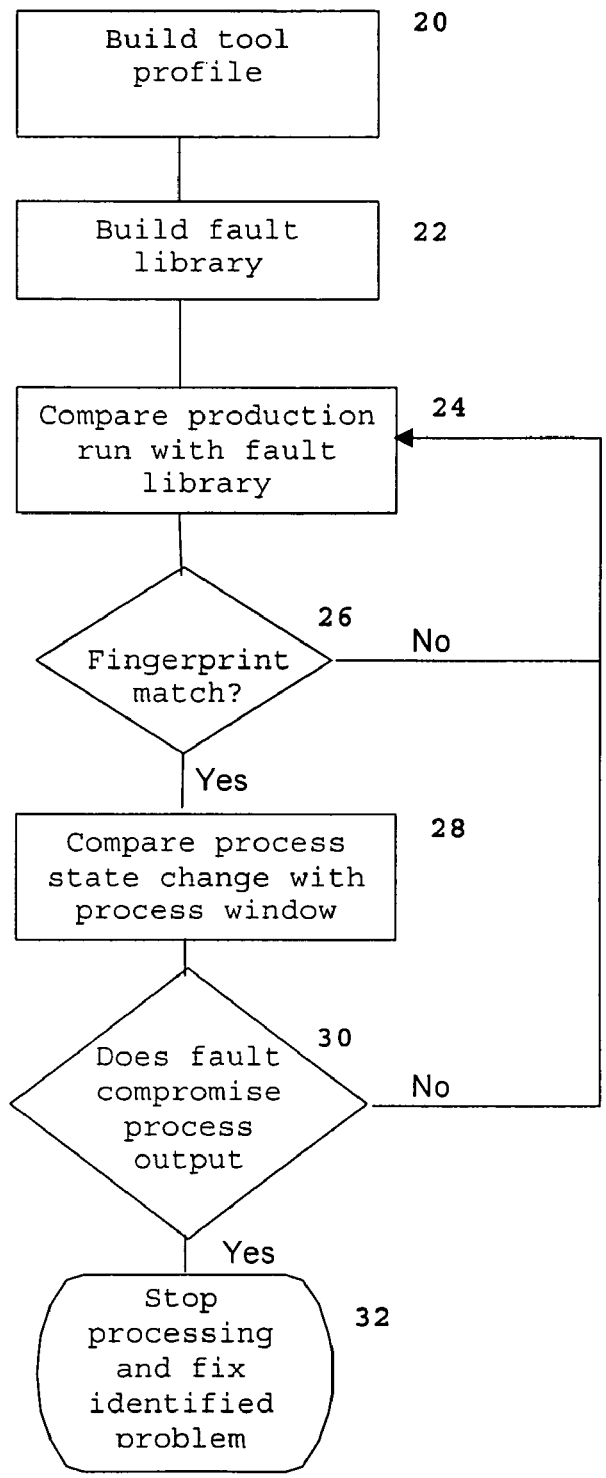
FIG. 9 is a flow diagram of a first embodiment of the invention.

Referring now to FIG. 9 which shows the first embodiment in more detail, tool profile data is saved as a plurality of response curves of the kind shown in FIG. 5 relating tool state (e.g. RF power, gas flow) to sensor output (e.g. voltage, current, phase), step 20. Fault condition data is captured and added to a fault library, step 22, by forced changes to process inputs; by adding additional fault fingerprint data to the library as faults occur; or as explained above by importing fault fingerprint data from other tools. This last option allows fault libraries to be rapidly populated. Each fingerprint such as that of FIG. 7 can be tagged as a process change of a certain magnitude.

In a production run, the product wafer is monitored via the plurality of sensor outputs and continually compared to the fault library fingerprints, step 24. The deviation in both magnitude and direction of the sensor outputs from their expected nominal values for the tool are compared with the corresponding values of each fingerprint. Although there are many possible approaches, in this embodiment, the comparison is based on mathematical correlation. However, Euclidean distance could also be employed. Thus, when a correlation value exceeds a given threshold or a Euclidean distance is below a given threshold, a fault condition is flagged, step 26. The impact of the fault is then determined, step 28, by comparing the magnitude of the fault, determined from the tool profile, FIG. 5, with process dependency data such as that shown in FIG. 8. If the fault is determined to have a negative or unacceptable impact on process output, step 30, then the tool is stopped and the identified problem is fixed, step 32.

It will be readily appreciated that the above process can be implemented by the person skilled in the art as a computer program having the relevant sensor values, after analog-digital conversion, as inputs.

It is to be understood that the changes in the process input parameters which the method is designed to detect are not those such as occur in response to changes in the relevant external input settings. Rather, it is changes which occur despite such input settings remaining nominally unchanged through some fault in the plasma process. For example, a mass flow rate sensor could develop a fault so that the actual rate of introduction of gas into a chamber varied from the value indicated by the sensor; or a match unit could absorb power so that the delivered RF power was less than that indicated on the power meter associated with the RF source.

The method described above can also be used to determine changes in process conditions which do not necessarily cause product faults but do affect process output which may become product faults. For example, referring to FIG. 8, it is possible to predict changes in the process output within the desired output specification if the change in the process input is known. For example, the method described here can be used to determine a fault such as a change in process power. It may be determined that the change does not push the CD outside the desired specification but it may result in wider CDs. Although the final product is not catastrophically effected, it may indicate a trend so that the operator can predict a fault having a negative or unacceptable impact on process output before it occurs.

The method can also be used for closed loop process control since the magnitude of the fault is known. For example, in the case of FIG. 3 at wafer 1018, a pressure set point fault could be detected with the present method. The operator can either stop the process and fix the problem or elect to change the pressure based on the predicted change, ignoring the defective pressure gauge. Furthermore, in this example since the pressure change can be used to predict a change in process output, the operator can change the pressure based on the prediction of process output.

In the foregoing embodiment, detecting faults is based only on recognising a stored fingerprint of a fault state. That is, fault detection proceeds by comparing the present state of the manufacturing equipment with a library of undesired states. Only if the present condition of the tool is recognised as a fault condition is it flagged. Therefore, there are essentially no false positives and both fault detection and fault identification are synonymous. Furthermore, having determined that the present state matches a fault state, the magnitude of the fault is determined and compared with the fault tolerance of the tool for the particular process. Thus, the fault condition can be ignored if it has no adverse effect on process output.

The embodiment has at least the following advantages over the prior art:

(a) Faults are detected by a pattern recognition method so that statistical anomalies do not trigger false alarms, (b) The robustness of the fingerprint identification is not compromised by normal interventions made by the user in the process environment, such as preventative maintenance (c) The magnitude of a fault is easily interpreted and can be reported on scale of importance to a user, (d) There is no necessity to rely on accurate continuous in-situ measurement of process quality, for example, by measuring product characteristics such as CD. This method predicts process quality based on determination of any fault that would effect process quality, (e) The library of fingerprints is portable so that scalability across sets of tools is possible.

In a second embodiment of the invention, the technique described above is applied to plasma chamber matching. It will be recognised that in the first embodiment, each tool profile (which it will be recalled differs from chamber to chamber, even for chambers of the same type running the same recipe) has to be generated when the relevant chamber is in a known good state. The second embodiment compares any given chamber under test to a known good (reference) chamber of the same type running the same recipe to determine if the test chamber is also good, i.e. matched to the reference chamber.

As mentioned in the introduction, the raw sensor data from the test and reference chambers cannot be used to compare the chambers because the variations in sensor output from chamber to chamber can be so large that "real" (i.e. significant) chamber differences are masked by benign chamber differences and sensor-to-sensor differences.

Figure 10:
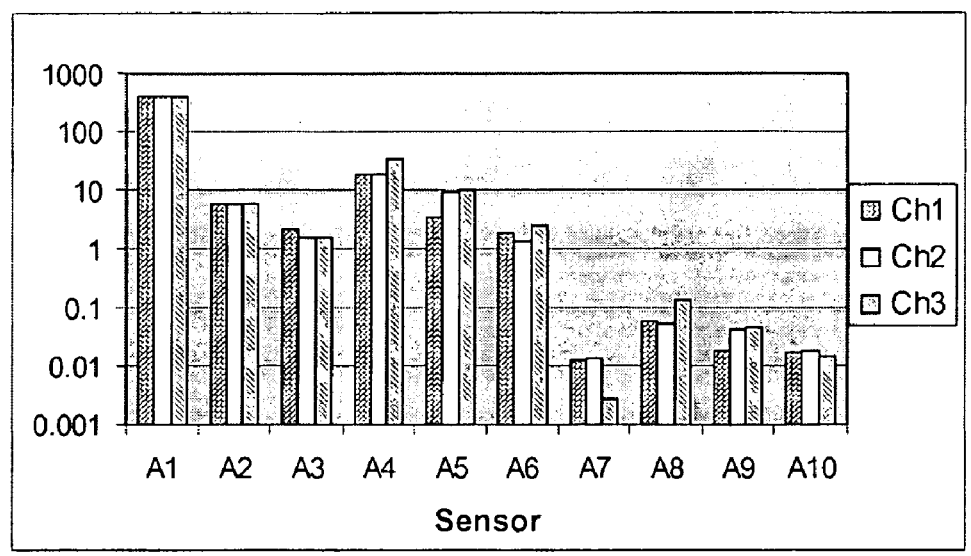
FIG. 10 shows sensor data from three different process chambers.
Figure 10:
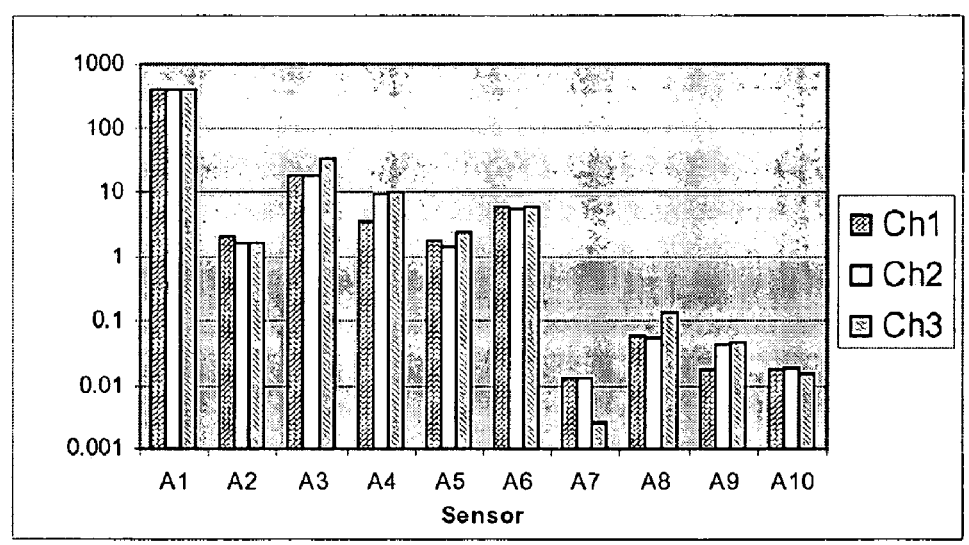

For example, FIG. 10 shows sensor data from three plasma chambers. These three chambers are outwardly matched in that each one is built to the same specification and runs the same recipe. All input controls are calibrated to a standard. However, in this case it was found that the output from chamber 2 was different. In particular, the etch rate from chamber 2 was lower than that from chamber 1 and 3 and is below acceptable process quality specification. The sensor data A1 to A10 is multi-dimensional data from a single sensor, but is representative of any chamber sensor data set. FIG. 10A shows sensor data from each of the chambers where a different sensor is used on each chamber. In this case, there is no evident difference between the bad chamber and the good ones, since the "real" difference are confounded by the sensor differences and benign chamber differences. FIG. 10B shows data from the same three chambers, now using the same sensor on all three chambers. Again, the bad chamber does not particularly stand out, the "real" differences now being confounded by the benign differences.

The difficulty is also apparent from FIG. 3, already described, which shows how the sensor data trends with time and undergoes large changes at a PM event. Chambers at different points in this cycle will output very different sensor data. These are classed as benign chamber-to-chamber differences since they do not affect chamber output and are part of normal chamber operation. Therefore, the raw sensor data does not easily return information on real chamber differences, although it does contain the information.

Figure 11:
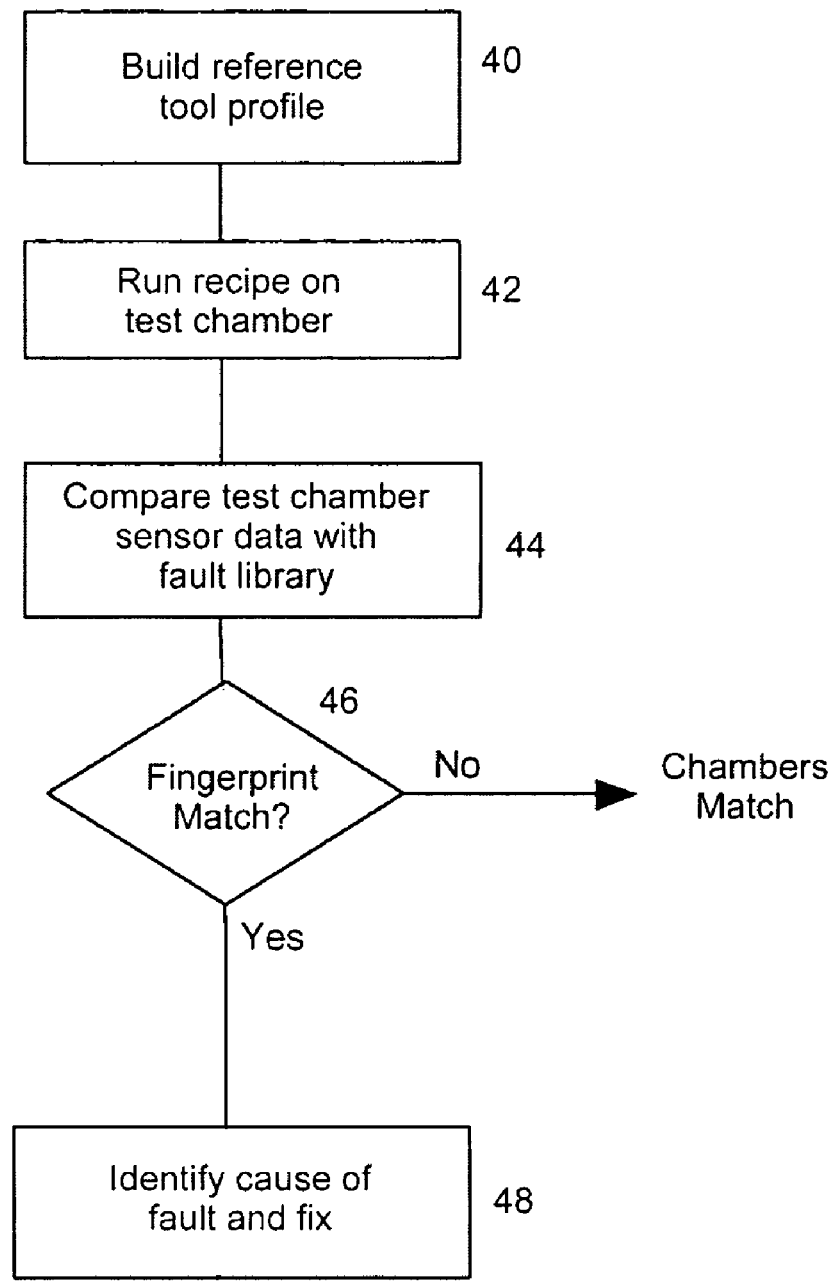
FIG. 11 is a flow diagram of a second embodiment of the invention.

Accordingly, in the second embodiment, FIG. 11, a tool profile for the reference chamber, running a particular recipe, is first determined as previously described for the first embodiment, step 40. Next, step 42, the same nominal recipe is run on the test chamber and, step 44, the deviation in terms of both magnitude and direction of the sensor outputs from nominal values for the present state of the test chamber are compared to the corresponding values of the fault fingerprints in the fault fingerprint library. The critical difference from the first embodiment, however, is that the nominal sensor values used to determine the present state vectors are those of the tool profile of the reference chamber, not the tool profile of the chamber under test. That is to say, each present state vector is the difference between the present value of a respective one of the sensors of the test chamber and the nominal value of the corresponding sensor in the test profile of the reference chamber. We have found that this largely eliminates the effect of benign and sensor-to-sensor differences on the comparison between the chambers. The comparison may be made by mathematical correlation or Euclidean distance, as previously described.

If a match to a fingerprint is not found at step 46 the test chamber is deemed to be matched to the reference chamber. However, if a match to a fingerprint is found, the test chamber is deemed to be faulty. The cause of the fault is identified at step 48 and the test chamber fixed to correct the fault. The cause of the fault can be identified from the particular fingerprint which is matched, since different fault fingerprints will relate to deviations in different chamber and/or process parameters.

Figure 12:
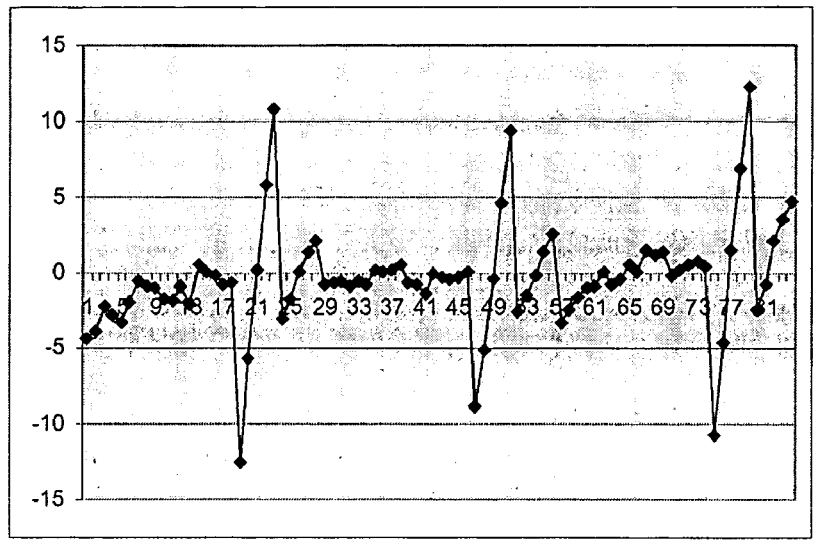
FIG. 12 shows the result of the method of the second embodiment applied to three test chambers.
Figure 12:
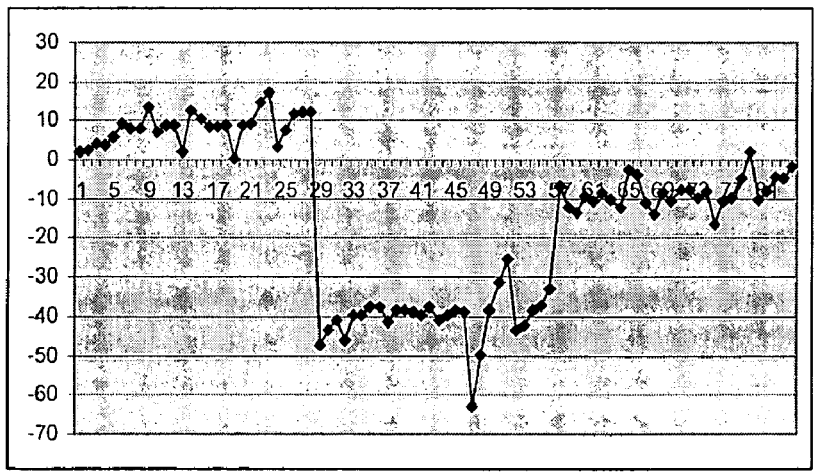

FIG. 12 shows sensor data processed from three test chambers. Points 1 to 28 are wafers run on chamber 1, points 29 to 56 are wafers run on chamber 2 and points 57 to 84 are wafers run on chamber 3. On each set of 28 points, changes are forced across the three chambers as shown in the table in FIG. 13. In FIG. 12A, the correlation between the present tool-state and a known fault fingerprint for a power change is tested. The y-axis is the magnitude of a predicted change in power in this case. As is evident, the power change is correctly identified on the appropriate wafers on each chamber. In FIG. 12B, the correlation between the present chamber state and a fault fingerprint for process temperature is tested. The process temperature fault fingerprint was previously learned and added to the fault fingerprint library by inducing a change in wafer substrate temperature setting and learning the fingerprint. Note how each chamber shows a different magnitude for the process temperature match across all wafers. This indicates that the chambers are not well matched in temperature. Thus the root cause difference is identified and can subsequently be repaired. In FIG. 12B it can also be seen that a change in power in the test is also flagged as a temperature change. This is expected, since a change in plasma power on this tool type will change the wafer temperature.

As in the case of the first embodiment, it will be appreciated that the above process can be implemented by the person skilled in the art as a computer program having the relevant sensor values, after analog-digital conversion, as inputs.

The invention is not limited to the embodiment described herein which may be modified or varied without departing from the scope of the invention.

The invention claimed is:

1. A method of fault detection in a semiconductor substrate chamber processing tool having at least one sensor providing a plurality of data sensitive to tool-state and process-state changes, the method comprising the steps of:
   (a) establishing a set of vectors representing the magnitude and direction of the deviation of sensor data from nominal values for a state of the tool under a fault condition, said fault condition generating a recordable fault fingerprint,
   (b) performing step (a) a plurality of times for a plurality of different fault conditions respectively and storing the resultant sets of vectors in a fault fingerprint library, the fault fingerprints being substantially invariant across different tools built to the same nominal specification and running the same nominal process,
   (c) determining a set of vectors representing the deviation of sensor data from nominal values for the present state of the tool, and
   (d) detecting a fault based on a comparison of the present state set of vectors with at least one fault fingerprint in the fault fingerprint library.

2. The method claimed in claim 1, wherein the nominal values used for calculating the set of vectors for the present state are nominal values of the sensor data from the sensor of the said tool.

3. The method claimed in claim 1, wherein the nominal values used for calculating the set of vectors for the present state are nominal values of the sensor data from the sensor of different manufacturing equipment built to the same nominal specification and running the same nominal process as the first mentioned manufacturing equipment.

4. The method claimed in claim 1, wherein the comparison is made by correlation between the sets of fault fingerprint and present state vectors.

5. The method claimed in claim 1, wherein the comparison is made by calculating a Euclidean distance between the sets of fault fingerprint and present state vectors.

6. The method claimed in claim 1, further comprising the step of predicting the impact of the fault on a particular process output.

7. The method claimed in claim 1, further comprising the step of controlling at least one tool input to compensate for the fault.

8. The method claimed in claim 1, wherein the fault fingerprint is derived from a tool profile comprising a set of tool input versus sensor response curves.

9. The method claimed in claim 1, wherein the tool comprises a plasma chamber.

10. A computer readable medium containing program instruction which, when executed by a data processing device, perform the method steps claimed in claim 1.

* * * * *